United States Patent [19]

Ouchi et al.

[11] Patent Number: 4,562,555
[45] Date of Patent: Dec. 31, 1985

[54] SEMICONDUCTOR MEMORY DEVICE

[75] Inventors: Yoshiaki Ouchi, Tokorozawa; Masamichi Ishihara, Tokyo; Tetsuro Matsumoto, Tachikawa; Kazuyuki Miyazawa, Kodaira, all of Japan

[73] Assignees: Hitachi, Ltd.; Hitachi Microcomputer Engineering Ltd., both of Tokyo, Japan

[21] Appl. No.: 535,232

[22] Filed: Sep. 23, 1983

[30] Foreign Application Priority Data

Sep. 24, 1982 [JP] Japan .................... 57-164911

[51] Int. Cl.$^4$ .................................................. G11C 7/00
[52] U.S. Cl. ..................................... 365/233; 365/189
[58] Field of Search ............... 365/189, 230, 233, 239, 365/240

[56] References Cited

U.S. PATENT DOCUMENTS 4,402,067 8/1983 Moss et al. .................... 365/189 X

FOREIGN PATENT DOCUMENTS

| 2946633 | 6/1980 | Fed. Rep. of Germany . |
| 3200880 | 8/1982 | Fed. Rep. of Germany . |
| 1316300 | 5/1973 | United Kingdom . |
| 1533997 | 11/1978 | United Kingdom . |
| 1568379 | 5/1980 | United Kingdom . |
| 2091916 | 8/1982 | United Kingdom . |

OTHER PUBLICATIONS

Charles Cohen, "NEC Slates Moly for 256-K Ram", Electronics, Sep. 22, 1981, pp. 78–79.
Douglas Eidsmore, "256K DRAM Highly Immune to Soft Errors", Computer Design, vol. 4, Apr. 1982, pp. 42 and 46.

Primary Examiner—Joseph A. Popek
Attorney, Agent, or Firm—Antonelli, Terry & Wands

[57] ABSTRACT

An address multiplex type system for a dynamic RAM includes a memory cell array having a plurality of memory cells which are simultaneously selected by signals output from an address decoder, a decoder, and a shift register. The dynamic RAM further includes a selecting circuit which receives a plurality of address signals applied externally through one of a plurality of pins of a package in a time-sharing manner and makes it possible to write or read data into or from one memory cell of the plurality of memory cells selected. The dynamic RAM can read out or write in serially data of a plurality of memory cells selected from the memory cell array when a shift register operates. The dynamic RAM can also read or write data serially into or from a plurality of memory cells selected from the memory cell array simply by connecting the pin to a predetermined potential. When the data is written or read serially, the pin arrangement of the package of a 256K bit dynamic RAM can be substantially the same as that of the package of a 64K bit dynamic RAM. Hence, compatibility can be established between the 256K bit dynamic RAM and a 64K bit dynamic RAM.

35 Claims, 6 Drawing Figures

SEMICONDUCTOR MEMORY DEVICE

BACKGROUND OF THE INVENTION

This invention relates to a semiconductor memory device and more particularly to a dynamic random access memory (hereinafter referred to as a "dynamic RAM") having an operating mode in which data of a plurality of bits can be read out or written in serially.

The address multiplex system, in which address signals are applied twice separately as an address designation system, has been employed in semiconductor memory devices with a large memory capacity, such as in 64K bit (65,536 bits) dynamic RAMs, in order to reduce the number of pins on the package holding the memory device. When this address multiplex system is used for a 64K bit dynamic RAM, the number of pins on the package may be 16. In other words, the 64K bit dynamic RAM is placed in a 16-pin package.

The function of each pin is standarized, as shown in FIG. 4, when packaging a 64K bit dynamic RAM in a 16-pin package. In other words, 16-bit address signals are applied twice separately to pins 5-7 and to pins 9-13. Pin 1 is generally used for refresh (although in FIG. 4 it is shown for the address bit $A_8$ used for 256K bit memories as will be explained hereafter), pins 2 and 14 are used as data input and output pins, and pin 3 as a write enable signal ($\overline{WE}$) input pin. Pins 4 and 15 are used as input pins for a row address strobe signal $\overline{RAS}$ (hereinafter referred to as "$\overline{RAS}$ signal") and a column address strobe signal $\overline{CAS}$ (hereinafter referred to as "$\overline{CAS}$ signal"), and pins 8 and 16 as power pins.

256K bit (=262,144 bits) dynamic RAMs have been developed extensively in recent years. The number of address signals is greater in a 256K bit dynamic RAM than in a 64K bit dynamic RAM. In order to construct a 256K bit dynamic RAM while securing an input pin for refresh control signals, therefore, the design concept of the conventional 64K bit RAM must be changed to either increase the number of pins or detect the refresh timing from the relationship of the timings of the $\overline{RAS}$ and $\overline{CAS}$ signals, thereby making it possible to use pin 1 of the 16-pin package as an input pin for an address signal $A_8$ as shown in FIG. 4. However, compatibility between the 64K bit dynamic RAM and the 256K bit dynamic RAM is lost in the former case. Although the latter case is compatible with 64K bit RAMs (because only 16 pins are necessary), it does prevent the normal use of the pin (i.e. pin 1) typically designated for the refresh operation. Also, this arrangement is somewhat slower in addressing speed than is sometimes desired.

In order to develop a dynamic RAM having a greater memory capacity such as a 1M bit (=1,024,000 bits) dynamic RAM, an increase in the number of pins is inevitable unless the design concept itself can be changed.

SUMMARY OF THE INVENTION

Accordingly, it is an object of the present invention to provide a semiconductor memory device which can have an increased memory capacity without increasing the number of pins receiving input address signals.

It is a further object to provide a memory addressing arrangement for large capacity memories which has a very high speed.

To achieve these and other objects, the present invention provides a semiconductor memory device having an operating mode in which data of a plurality of bits can be read out and written in serially after address signals have been given, without needing to apply the address signals thereafter, and an operating mode in which data can be read out or written in in one-bit units in accordance with the address signals.

BRIEF DESCRIPTION OF THE DRAWINGS

Further objects of the present invention will become more apparent from the following description taken in conjunction with the accompanying drawings, wherein.

DESCRIPTION OF THE PREFERRED EMBODIMENTS

Figure 1:
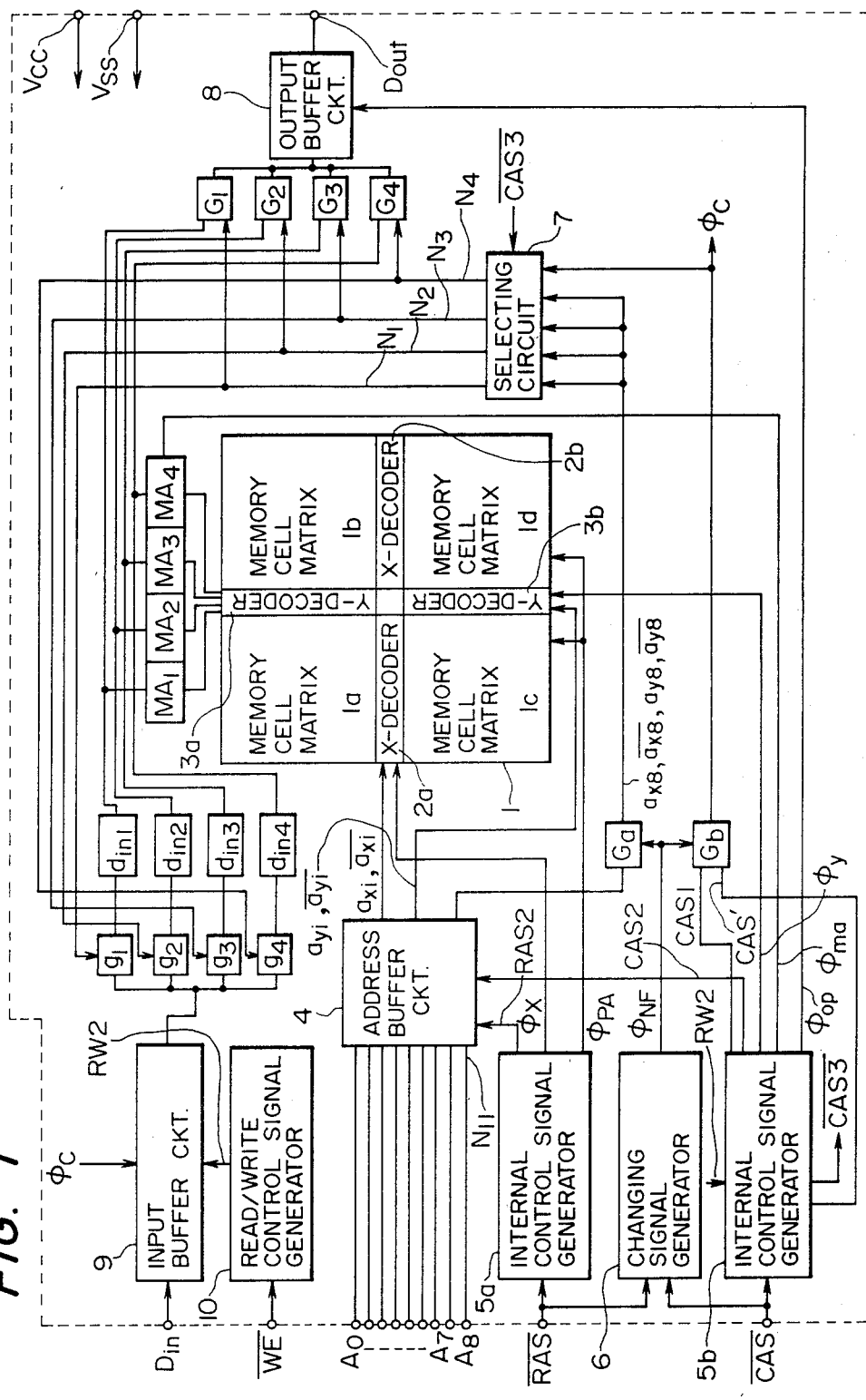
FIG. 1 is a block diagram of a semiconductor memory device in accordance with one embodiment of the present invention.

FIG. 1 is a block diagram of a 256K bit dynamic RAM to which the present invention is applied. The so-called "nibble mode" function which can read and write serial data of a plurality of bits, such as 4 bits, is added to the dynamic RAM of this embodiment. The dynamic RAM of this embodiment can also be used as an ordinary 256K bit dynamic RAM by utilizing the first pin as an input pin for an address signal $A_8$.

In the diagram, all the circuit blocks encircled by the broken line are formed on a single semiconductor substrate by known semiconductor integrated circuit techniques. Terminals $D_{in}$, $\overline{WE}$, $\overline{RAS}$, $\overline{CAS}$, $D_{out}$, $V_{cc}$, $V_{ss}$ and $A_0$ through $A_8$ are connected to the corresponding pins provided on the package. When this 256K bit dynamic RAM is used only in the nibble mode, however, the address of the most significant bit, the address signal $A_8$ in this embodiment, is not provided as will be described later. Hence terminal $A_8$ may be omitted and a refresh control terminal, for example, could be provided instead of this address signal terminal $A_8$, connected to the corresponding pin (pin 1) of the package. It will be necessary in such a case to provide the circuit necessary for the refresh operation on the 256K bit dynamic RAM, and apply a control signal controlling the operation of the refresh control terminal.

In the block diagram, reference numeral 1 represents a memory cell array, which is divided into four memory cell matrices 1a, 1b, 1c and 1d. Each memory cell matrix 1a-1d has a 64K bit memory capacity. In other words, 65,536 memory cells in each memory matrix are arranged in a matrix of 512 (rows) by 128 (columns). The memory cell matrices are disposed symmetrically about X decoders 2a, 2b and Y decoders 3a, 3b at the center.

Reference numeral 4 represents an address buffer circuit. A plurality of address signals are divided and applied twice from a microprocessor (hereinafter referred to as "CPU"), not shown, to the address buffer circuit 4. X address signals $A_{x0}$-$A_{x8}$ and Y address signals $A_{y0}$-$A_{y8}$ are applied in a time-sharing manner from the CPU to the address buffer circuit 4. The address buffer circuit 4 consists of a number of unit address buffers corresponding to the number of bits of the address signals applied to the buffer circuit 4. In this embodiment it consists of 18 unit address buffers. The unit address buffers each have the same construction and each has a latch function holding the input address signals, although the invention is not particularly limited to this.

Reference numerals 5a and 5b represent internal control signal generators. The internal control signal generator 5a generates suitable control signals RAS2, $\phi_x$ and $\phi_{PA}$ on the basis of $\overline{RAS}$ signals applied thereto from the CPU. The internal control signal generator 5b generates suitable control signals CAS1, CAS2, $\overline{CAS3}$, CAS', $\phi_y$, $\phi_{ma}$ and $\phi_{OP}$ on the basis of the $\overline{CAS}$ signals applied thereto from the CPU.

Figure 2:
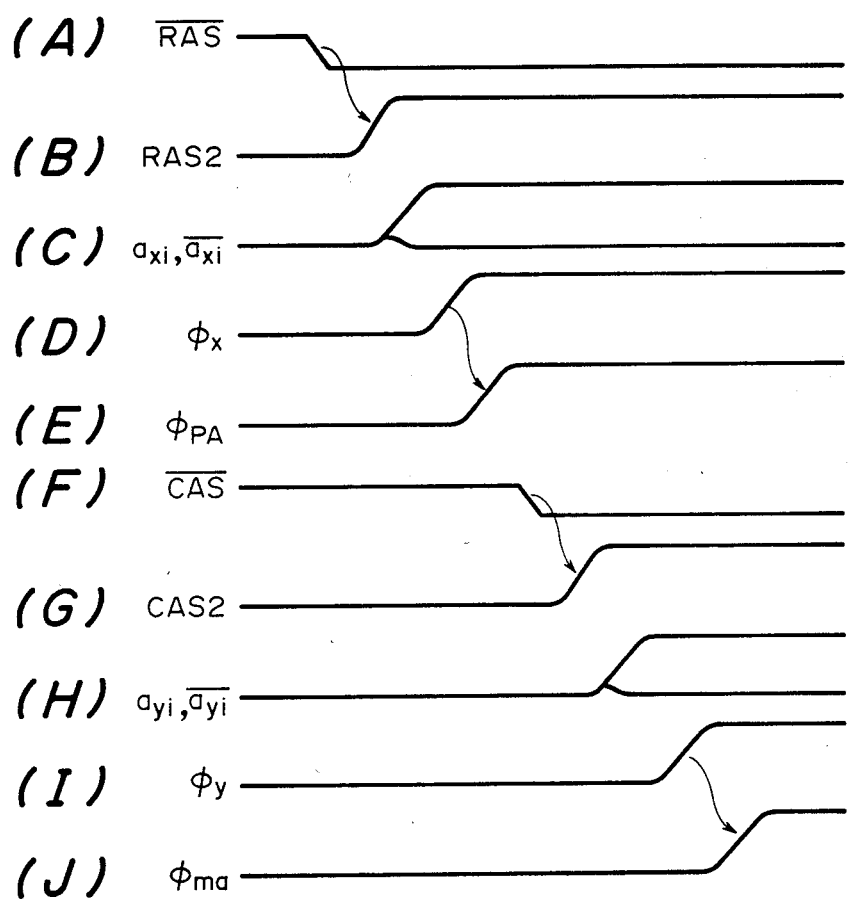
FIG. 2 is a timing chart of the device of FIG. 1 when operating normally.

The signal RAS2 output from the internal control signal generator 5a is applied to the address buffer circuit 4. When the external $\overline{RAS}$ signal falls from high level to low level, the signal RAS2 rises in synchronism with it, as shown in FIG. 2. Accordingly, the address buffer circuit 4 takes in and latches the X address signals $A_{x0}$-$A_{x8}$ and outputs both internal address signals $a_{x0}$-$a_{x8}$ corresponding to the address signals $A_{x0}$-$A_{x8}$, and internal address signals $\overline{a_{x0}}$-$\overline{a_{x8}}$ that are phase-inverted with respect to the address signals $A_{x0}$-$A_{x8}$.

The signal $\phi_x$ (word line selection timing signal) output from the internal signal generator 5a and the internal address signals $a_{xi}$, $\overline{a_{xi}}$ (i=0-7) output from the address buffer circuit 4 are applied to the X decoders 2a and 2b, respectively. The word line selection timing signal $\phi_x$ rises to the high level shortly after the signal RAS2 when the $\overline{RAS}$ signal falls to the low level. Accordingly, the right and left X decoders 2a and 2b each select one word line determined by the internal address signals $a_{xi}$, $\overline{a_{xi}}$ (i=0-7) supplied from the address buffer circuit 4, and bring the lines to a selection level. In other words, a word line determined by the address signals $A_{x0}$-$A_{x7}$ is selected from each of the memory cell matrices 1a-1d. When the signal $\phi_{PA}$ applied from the internal signal generator 5a to each memory cell matrix 1a-1d rises next, the data from all the memory cells connected to the word lines selected by the X decoders 2a, 2b are amplified by corresponding pre-amplifiers (not shown), and are each latched.

The signal CAS2 output from the internal signal generator 5b is also applied to the address buffer circuit 4 in the same way as the signal RAS2. When the external $\overline{CAS}$ signal falls from high level to low shortly after the $\overline{RAS}$ signal described above, the signal CAS2 rises in synchronism with it, as shown in FIG. 2. When this happens, the address buffer circuit 4 takes in the Y address signals $A_{y0}$-$A_{y8}$ applied thereto and latches them. The buffer 4 then outputs both internal address signals $a_{y0}$-$a_{y8}$ corresponding to the address signals $A_{y0}$-$A_{y8}$, and internal address signals $\overline{a_{y0}}$-$\overline{a_{y8}}$ that are phase-inverted with respect to the address signals $A_{y0}$-$A_{y8}$. Of these internal address signals, the internal address signals $a_{y0}$-$a_{y7}$ and $\overline{a_{y0}}$-$\overline{a_{y7}}$ are applied to the Y decoders 3a, 3b, respectively.

The signal $\phi_y$ (data line selection timing signal) generated by the internal signal generator 5b is applied to the Y decoders 3a and 3b. The data line selection timing signal $\phi_y$ rises a little after the signal CAS2, as shown in FIG. 2. When the signal $\phi_y$ rises, the Y decoders 3a and 3b each select one data line (or a data line pair) corresponding to the address signals $A_{y0}$-$A_{y7}$ from the memory matrices 1a-1d.

The signal $\phi_{ma}$ generated by the internal signal generator 5b is applied to four main amplifiers MA1 through MA4. The signal $\phi_{ma}$ rises a little after the data line selection timing signal $\phi_y$, as shown in FIG. 2. When the signal $\phi_{ma}$ rises, the data that is latched by four pre-amplifiers connected to the four data lines (or four data line pairs) selected by the Y decoders 3a and 3b are simultaneously amplified by the main amplifiers MA1-MA4 and are latched.

The $\overline{RAS}$ signal and the $\overline{CAS}$ signal are also applied to a changing signal generator 6. When pin 1 of the package containing the semiconductor memory device is used as an input pin for an address signal, namely when the address signals $A_{x8}$ and $A_{y8}$ (the bits with the highest addresses) are applied to pin 1 in a timesharing manner, the $\overline{RAS}$ signal goes from high level to low, and then the $\overline{CAS}$ signal goes from high level to low. Thereafter, these signals are kept at low level. Accordingly, the changing signal generator 6 produces a control signal $\phi_{NF}$ of low level. In response to the control signal $\phi_{NF}$ of low level, a gate $G_a$ is opened, and a gate circuit $G_b$ outputs a control signal CAS1 as a control signal $\phi_c$.

Figure 6:
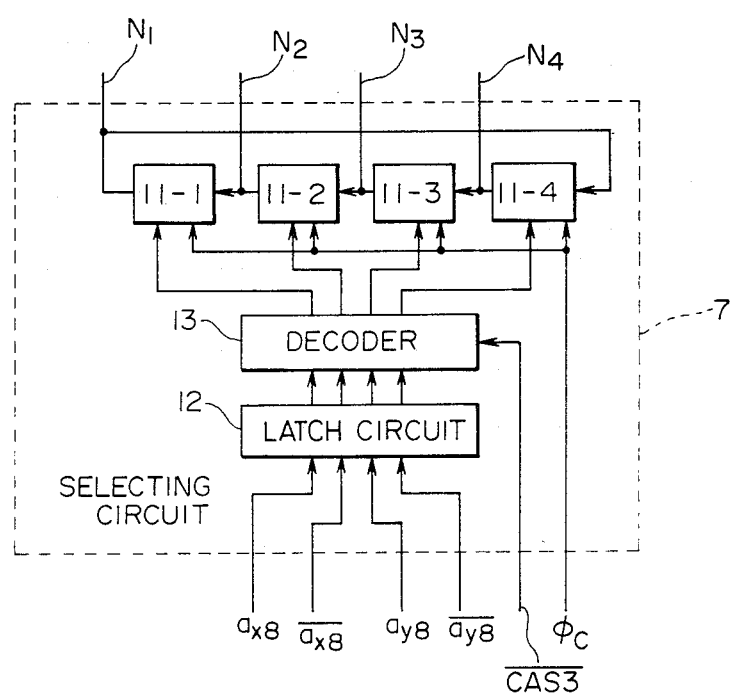
FIG. 6 is a block diagram of an example of the selecting circuit 7.

Reference numeral 7 represents a selecting circuit. FIG. 6 is a block diagram of an example of this selecting circuit 7. The selecting circuit 7 consists of a latch circuit 12 which latches the internal address signals $a_{x8}$, $\overline{a_{x8}}$ and $a_{y8}$, $\overline{a_{y8}}$ applied thereto in a time-sharing manner, a decoder 13 for decoding signals output from the latch circuit 12, that is, the internal address signals, and a shift register 11 for receiving decoded signals output from the decoder 13. The shift register 11 consists of four registers 11-1, 11-2, 11-3 and 11-4 that correspond in a one-to-one way to the decoded signals from the decoder 13. When the control signal (shift pulse) $\phi_c$ rises to high level, for example, each register receives either the corresponding decoded signal from the decoder 13 or the signal output from the register of the preceding stage as its input signal, and outputs a signal corresponding to the input signal when the shift pulse $\phi_c$ falls to low level. Each register consists of a one-bit memory circuit such as a flip-flop circuit, although the present invention is not particularly limited to this.

In the normal mode, the gate $G_a$ is opened by the control signal $\phi_{NF}$ of low level from the changing signal generator 6, and the internal address signals $a_{x8}$, $\overline{a_{x8}}$, $a_{y8}$ and $\overline{a_{y8}}$ are applied to the latch circuit 12 in a time-sharing manner through this gate $G_a$. The internal address signals thus latched in the latch circuit 12 are input to, and decoded by, the decoder 13. Each decoded signal is applied to the corresponding register 11-1 to 11-4. At the same time, the control signal CAS1 is applied to each register as the control signal $\phi_c$ through the gate $G_b$ since $\phi_{NF}$ is at low level. The control signal CAS1 is a pulse signal with a predetermined pulse width that is formed to rise in synchronism with the $\overline{CAS}$ signal falling to low level. When this pulse signal CAS1 rises to high level, for example, each register takes in the decoded signal supplied from the decoder 13, and produces a decoded signal as its output when the pulse signal falls to low level. Accordingly, one of output lines $N_1$-$N_4$ connected to these registers is brought to high level, and the others to low level. One of gates $G_1$-$G_4$ is correspondingly opened by the output line of the selecting circuit 7 which is high level, so that one unit of the data latched in the main amplifiers MA1--

MA4 is applied to an output buffer circuit 8 and is output externally.

In other words, in the data read from each of the 4 memory cell matrices, only the data determined by the address signals $A_{x8}$, $A_{y8}$ (highest address bits) is applied to the output buffer circuit 8. The output buffer circuit 8 outputs the applied data at the timing of the signal $\phi_{OP}$ output from the internal signal generation circuit 5b.

Reference numeral 9 represents an input buffer circuit to which data is applied externally. Reference numeral 10 represents a read/write control signal generator to which a write enable signal $\overline{WE}$ is applied. The write enable signal $\overline{WE}$ is kept at high level during the data reading operation. In response to this high-level write enable signal $\overline{WE}$, the read/write control signal generator 10 produces a signal RW2 of a potential that renders the input buffer circuit 9 inoperative. Accordingly, the input buffer circuit 9 is kept inoperative during the data reading operation.

The write enable signal $\overline{WE}$ is kept at low level during the data writing operation. In response to the low-level write enable signal $\overline{WE}$, the read/write control generator 10 produces a signal RW2 of a potential that renders the input buffer circuit 9 operative. Hence the input buffer circuit 9 is made operative, and generates an output signal which corresponds to the data $D_{in}$ applied thereto externally. The selecting circuit 7 operates in the same manner as was described above for the reading operation. Thus the selecting circuit 7 opens only one of four gates $g_1$ through $g_4$ that is determined by the input address signals $A_{x8}$ and $A_{y8}$. The signal output from the input buffer circuit 9 is sent to the corresponding driver of four drivers $d_{in1}$–$d_{in4}$ through the gate that has been opened.

A signal output from the driver which has received the signal output from the input buffer circuit 9 through the selected gate is applied to the memory array 1 via the corresponding main amplifier of the four main amplifiers MA1-MA4. The X decoders 2a, 2b and the Y decoders 3a, 3b each select one memory cell from the memory cell matrices 1a-1d determined by the address signals $A_{x0}$-$A_{x7}$ and $A_{y0}$-$A_{y7}$ applied to these decoders. The memory cell matrices and the main amplifiers correspond in a one-to-one fashion. A signal output from the main amplifier of the four main amplifiers MA1–MA4 which has received the signal output from the input buffer circuit 9 is applied to, and written into, the selected memory cell of the corresponding memory cell matrix.

In this case (i.e. during the data writing operation), the signal $\phi_{OP}$ of a potential (high level) that renders the output buffer circuit 8 operative is not applied to the buffer circuit 8 from the internal signal generator 5b, so that the buffer circuit 8 does not operate. The signal $\phi_{OP}$ is generated on the basis of the control signal RW2 from the read/write control signal generator 10, or the like, and goes to low level when data is to be written in. The signal $\phi_{OP}$ goes to high level when data is to be read out.

When the 256K bit dynamic RAM is used in the nibble mode, the address signals $A_{x0}$-$A_{x8}$ and $A_{y0}$-$A_{y8}$ are taken into the address buffer circuit 4 as a result of the first fall of the $\overline{RAS}$ signal and the first fall of the $\overline{CAS}$ signal, in the same way as in the normal operating mode described above. Accordingly, one memory cell is selected from each of the four memory cell matrices by the address signals $A_{x0}$-$A_{x7}$ and $A_{y0}$-$A_{y7}$ in the same way as in the normal operating mode described above, and one memory cell is selected by the address signals $A_{x8}$ and $A_{y8}$ from the four memory cells thus selected. In other words, the selecting circuit 7 changes only one output line determined by the address signals $A_{x8}$ and $A_{y8}$ to high level, and the rest to low level.

Figure 3:
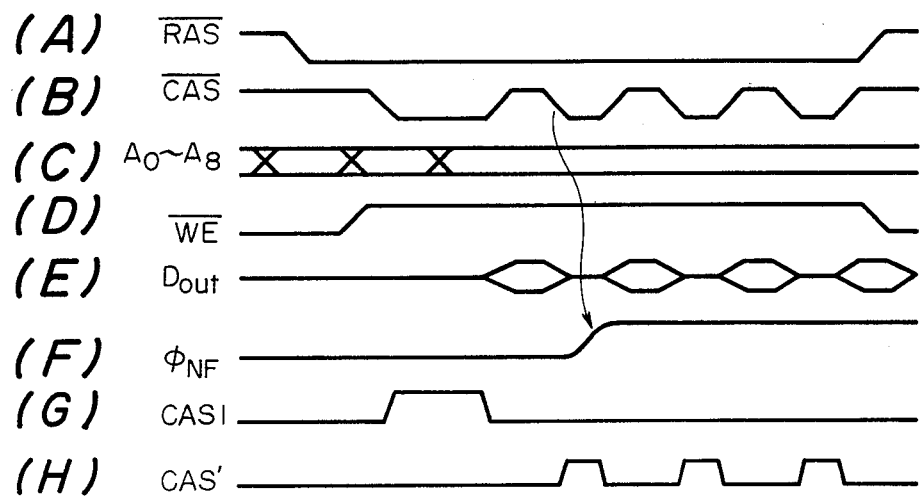
FIG. 3 is a timing chart of the device when in nibble mode.

However, unlike the normal mode shown in FIG. 3, in the nibble mode, the $\overline{CAS}$ signal is made to change with a short period, as shown in FIG. 3, while the $\overline{RAS}$ signal is kept at low level. Based on this, the changing signal generator 6 judges whether the mode is normal mode or nibble mode from the $\overline{RAS}$ signal and the $\overline{CAS}$ signal. When the $\overline{CAS}$ signal falls to low level after the $\overline{RAS}$ signal has fallen to low level and the $\overline{CAS}$ signal does not change thereafter (normal mode), the changing signal generator 6 produces the low-level control signal $\phi_{NF}$ as described above. On the other hand, when the $\overline{CAS}$ signal falls to low level after the $\overline{RAS}$ signal has fallen to low level and the $\overline{CAS}$ signal changes again thereafter (nibble mode), the control signal $\phi_{NF}$ is changed from low level to high level in synchronism with the second fall of the $\overline{CAS}$ signal to low level. Since the control signal $\phi_{NF}$ is thus changed to high level, the gate $G_a$ is closed and the gate $G_b$ produces a control signal CAS', provided from the generator 5b as the control signal $\phi_c$ rather than the signal CAS1 (which is passed when $\phi_{NF}$ is at high level).

Since the gate $G_a$ is closed, the signals (the internal address signals $a_{x8}$, $\overline{a_{x8}}$, $a_{y8}$, $\overline{a_{y8}}$) output from the address buffer circuit 4 are no longer applied to the selecting circuit 7. The gate $G_b$ applies the control signal CAS' as the control signal $\phi_c$ to the selecting circuit 7, so that it operates like a shift register. The control signal CAS' is a signal that is formed based on the $\overline{CAS}$ signal and rises to high level in synchronism with the fall of the $\overline{CAS}$ signal to low level. When the $\overline{CAS}$ signal again falls, the control signal CAS' rises again in response, as shown in FIG. 3. In other words, in the nibble mode the control signal CAS' becomes a pulse signal which repeatedly rises from low level to high then falls from high level to low.

The output line of the selecting circuit 7 which first becomes high level in nibble mode is determined by the address signals $A_{x8}$ and $A_{y8}$ that are taken in at the fall of the $\overline{RAS}$ signal and at the first fall of the $\overline{CAS}$ signal, in the same way as in the normal mode described previously. In other words, the selecting circuit 7 operates in the nibble mode in the same way as in the normal mode until the $\overline{RAS}$ signal changes, and the $\overline{CAS}$ signal changes and then changes once again. Assume, for example, that the decoder 13 outputs to the register 11-2 a decoder signal of high level by the internal address signals $a_{x8}$, $\overline{a_{x8}}$, $a_{y8}$ and $\overline{a_{y8}}$ that are shaped based on the address signals $A_{x8}$ and $A_{y8}$ taken in at the fall of the $\overline{RAS}$ and $\overline{CAS}$ signals, and decoded low-level signals to the rest of the registers. In this case, since the shift clock $\phi_c$ (control signal CAS1) changes to high level, each register takes in the corresponding decoded signal from the decoder 13. When the shift clock $\phi_c$ (control signal CAS1) falls to low level, the signal output from the register 11-2 changes to high level and the outputs of the rest change to low level. The $\overline{CAS}$ signal then rises to high level. In synchronism with the rise of this $\overline{CAS}$ signal to high level, the internal control signal generator 5b produces the high-level control signal $\overline{CAS3}$. When the control signal $\overline{CAS3}$ rises to high level, the decoder 13 inside the selecting circuit 7 is rendered inoperative, and at the same time the signals output from the decoder 13 are not actually applied to the registers. Accordingly each register takes in the signal output from its preceding stage as its input.

In other words, when the $\overline{CAS}$ signal again falls to low level, the control signal $\phi_{NF}$ becomes high level and the control signal CAS' is applied as the shift clock $\phi_c$ to each register. When this shift clock $\phi_c$ (control signal CAS') rises to high level, the register 11-1, for example, receives the signal output from the register 11-2 of the preceding stage as its input and, similarly, the register 11-2 receives the signal output from the register 11-3 as its input. Since the shift register 11 consists of a loop of these registers 11-1 through 11-4, the register 11-4 receives the output from the register 11-1 of the preceding stage as its input.

Next, when the CAS' signal again falls to low level, each register outputs a signal corresponding to the input signal taken into that register. In the embodiment described above, therefore, the signal output from the register 11-1 becomes high level when the CAS' signal falls, and the signals output from the rest of the registers 11-2 through 11-4 change to low level. Whenever the $\overline{CAS}$ signal again rises to high level and falls to low level, the operation described above is repeated. In other words, the registers 11-2, 11-1, 11-4 and 11-3 output high-level signals in order. That is, whenever the $\overline{CAS}$ signal changes, the output lines $N_2$, $N_1$ $N_4$ and $N_3$ become high level in turn.

Accordingly, the gate circuits $G_1$ through $G_4$ ($g_1$-$g_4$) corresponding to the respective output lines of the selecting circuit 7 open sequentially. In the embodiment described above, the gate circuit $G_2$ ($g_2$) opens first and every time the $\overline{CAS}$ signal falls, the gate circuits $G_1$, $G_4$ and $G_3$ ($g_1$, $g_4$, $g_3$) open sequentially.

As described previously, one memory cell is selected from each of the four memory matrices by the address signals $A_{x0}$-$A_{x7}$ and $A_{y0}$-$A_{y7}$. Hence, the main amplifiers $MA_1$ through $MA_4$ corresponding to these memory matrices amplify and latch the data from the memory cells selected from the corresponding memory cell matrices.

Accordingly, one gate circuit is first opened by the address signals $A_{x8}$ and $A_{y8}$ and the data latched in the corresponding main amplifier is applied to the output buffer circuit 8 and output from it. Next, every time the $\overline{CAS}$ signal falls, the data latched in the remaining main amplifiers is applied sequentially to the output buffer circuit 8 and is read out sequentially. In the example described above, the data latched in the main amplifier $MA_2$ is output first, followed by the data latched in the main amplifier $MA_1$, that in $MA_4$, and that in $MA_3$.

Since the shift register 11, which operates so as to read out the 4-bit data from the main amplifier in the nibble mode, is driven by changes in the $\overline{CAS}$ signal in the manner described above, the data can be read out at a higher speed than in the conventional system in which the data is read out bit-by-bit from the memory cell array by changing the address signals.

When the data is written in the nibble mode, the read/write control signal generator 10 generates a control signal RW2 that renders the input buffer circuit operative, in accordance with the write enable signal $\overline{WE}$ of low level. In this case, the output buffer circuit 8 is rendered inoperative by the signal $\phi_{OP}$. In a write operation, as with the read operation described above, the shift register 11 in the selecting circuit 7 is operated by the change in the $\overline{CAS}$ signal. Thereby the 4-bit data is written sequentially into the memory cells of the corresponding memory matrix of the memory matrices 1a-1d through the gate circuits $g_1$-$g_4$.

Assume, for example, that in the same way as in the read operation described above, the output line $N_2$ of the selecting circuit 7 is first to become high level and the output lines $N_1$, $N_4$ and $N_3$ in order become high level sequentially in accordance with the change of the $\overline{CAS}$ signal. The first unit of data is transmitted to a memory cell inside the memory matrix 1b, for example, via the gate $g_2$, and the next item of data is transmitted to a memory cell in the memory cell matrix 1a via the gate $g_1$. Similarly, the subsequent data is transmitted and written into a memory cell in the memory matrix 1d via the gate $g_4$, and into a memory cell inside the memory matrix 1c via the gate $g_3$, respectively. In the memory matrices 1a-1d, the memory cells into which the data is written are the memory cells determined by the address signals $A_{x0}$-$A_{x7}$ and $A_{y0}$-$A_{y7}$. To prevent unwanted data from being written into the memory cells, the control signal $\phi_c$ is applied to the input buffer circuit 9. This circuit 9 takes in external data in synchronism with the control signal $\phi_c$ to prevent unwanted data from being transmitted to the memory cells.

When the $\overline{RAS}$ signal and the $\overline{CAS}$ signal fall to low level to read out or write in data after this dynamic RAM has been used in the nibble mode, new internal address signals corresponding to the address signals that will be used this time are applied to the latch circuit 12 via the gate $G_a$. The internal control signal generator 5b outputs the control signal $\overline{CAS3}$ of low level. This means that the decoder 13 receives new internal address signals, decodes them and applies the decoded signals to the shift register 11. When the shift clock $\phi_c$ rises to high level, the shift register 11 takes in the decoded signals; and when the shift clock $\phi_c$ falls to low level, the shift register 11 outputs signals corresponding to the decoded signals that were taken into it. If the subsequent operating mode is normal mode, the normal mode operation described above is executed. On the other hand, if it is nibble mode, the nibble mode operation is executed as described above.

In the nibble mode, 4-bit data can be read out or written in serially in the manner described above simply by changing the $\overline{CAS}$ signal once the X address signals $A_{x0}$-$A_{x8}$ and the Y address signals $A_{y0}$-$A_{y8}$ are applied to establish which memory array is to be addressed first. In the normal operating mode, data can be read out or written into one desired memory cell by using pin 1 as the address signal pin $A_8$ and applying the address signals $A_{x8}$ and $A_{y8}$ in a time-sharing manner. Based on this related operation in the normal and nibble modes, the RAM of this embodiment can be used as an ordinary 356K bit RAM even in the nibble mode, if desired, by using pin 1 as the means for establishing which memory array will be addressed first.

On the other hand, when the semiconductor memory device of this embodiment is used in its nibble mode, the address signals applied to the same pin in the time-sharing manner are used as address signals that determine the initial state of the shift register used for selecting one memory cell from a plurality of memory cells selected from the memory cell array. Accordingly, if signals which correspond to the address signals are generated inside the semiconductor memory device instead of from outside the device, the pin normally used for external addressing for determining the initial shift register state (e.g. pin 1) can be used for purposes other than as the input pin for the address signals.

Figure 4:
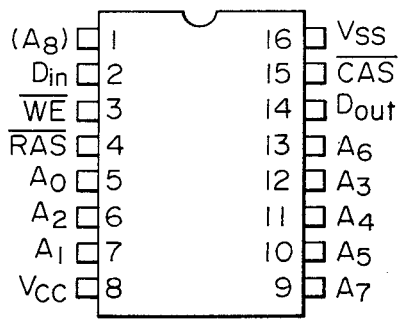
FIG. 4 is a schematic view of the arrangement of the pins of a 16-pin package when it contains a semiconductor memory device having a memory capacity of 64K bits or more.
Figure 5:
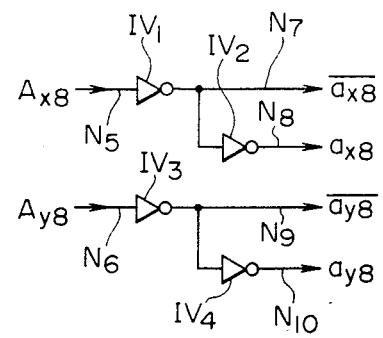
FIG. 5 is a circuit diagram of the device in accordance with one embodiment of the present invention.

As an example of the invention, the following construction may be employed using a circuit such as shown in FIG. 5 in the address buffer 4. First, an input node $N_{11}$ of the address signal $A_8$ of the address buffer circuit 4 is isolated electrically from the address signal input pin (pin 1) shown in FIG. 4 and the node $N_{11}$ is then connected to a predetermined potential point such as the ground potential point of the circuit. The input node $N_{11}$ is coupled to input nodes $N_5$ and $N_6$ of FIG. 5 through a multiplexor (not shown) which can be located in the address buffer 4 and controlled by control signals from the signal generators 5a and 5b. This multiplexor provides the nodes $N_5$ and $N_6$ with the address signals $A_{x8}$ and $A_{y8}$ from the signal at node $N_{11}$. Then, as shown in FIG. 5, the input node $N_5$ of inverters $IV_1$, $IV_2$ forming the address signals $a_{x8}$ and $\overline{a_{x8}}$ from the X address signal $A_{x8}$ and the input node $N_6$ of inverters $IV_3$, $IV_4$ forming the address signals $a_{y8}$ and $\overline{a_{y8}}$ from the Y address signal $A_{y8}$ are each set to predetermined potentials by virtue of the connection of node $N_{11}$ to a predetermined potential. Nodes $N_7$ through $N_{10}$ shown in the figure are each connected to predetermined potentials. According to this arrangement, the address signal input pin (pin 1) can be used for other purposes. If pin 1 thus saved is used as a pin for a refresh control signal, the dynamic RAM of this embodiment can be made compatible with conventional 64K bit RAMs; and its capacity can be increased. In such a case, the circuit necessary for the refresh operation must be provided within this semiconductor memory device.

If the address signals that would be applied externally to the same pin in a time-sharing way are generated instead within the semiconductor memory device as described above, the memory device always operates in nibble mode. Since the address signals $A_{x8}$ and $A_{y8}$ are always kept at respective predetermined potentials, the address signals $A_{x8}$ and $A_{y8}$ that are taken into the address buffer 4 at the first fall of the $\overline{RAS}$ signal and at the first fall of the $\overline{CAS}$ signal are always constant signals. Accordingly, the register of the plurality of registers forming the shift register 11 which first generates a high-level output signal is always the same in nibble mode. For this reason, the sequence of memory matrices from which the data is read, or into which it is written, is always the same.

If the signals applied to the selecting circuit 7 are generated within the semiconductor memory device as described above, the gate $G_a$ can be omitted provided that measures are taken to prevent the signals output from the selecting circuit 7 from exerting any adverse influence on the address buffer circuit 4.

If the nodes $N_7$ through $N_{10}$ in FIG. 4 are connected to their respective predetermined potentials in order to generate the signals to be applied to the selecting circuit 7 within the semiconductor memory device, the inverters $IV_1$ through $IV_4$ for the address signal $A_8$ can be omitted. This results in a reduction of the chip area and the production cost. However, the nodes $N_7$ and $N_8$ and the nodes $N_9$ and $N_{10}$ must be connected to mutually different potentials (e.g., $V_{ss}$ and $V_{cc}$).

In FIG. 6, a circuit which outputs signals having predetermined voltages to ths shift register 11 when the shift pulse $\phi_c$ (control signal CAS1) goes high level may be provided in place of the decoder 13 and the latch circuit 12. For example, the circuit may be disposed which outputs a high-level signal to the register 11-1 and low-level signals to the rest of the registers.

Although the above description deals with the case in which signals corresponding to the address signals normally to be applied externally to the same pin in a time-sharing manner are generated within the semiconductor memory device itself, a predetermined potential may be applied to pin 1 instead. For example, the ground potential of the circuit may be applied steadily to pin 1. In this case, the semiconductor memory device operates in the nibble mode in the same way as when the address signals are generated within the semiconductor memory device via a circuit such as FIG. 5. In this case, further, the number of address signals for the 256K bit dynamic RAM is equal to the number of address signals for a 64K bit dynamic RAM in the same way as when signals corresponding to the address signals are generated within the semiconductor memory device and, moreover, since the pin arrangement of the package of the 256K bit dynamic RAM is substantially the same as that of a 64K bit dynamic RAM, compatibility can be established between a conventional 64K bit dynamic RAM and the 256K bit dynamic RAM, and the capacity of the memory in the 16-pin package can be increased.

In the arrangement described above of providing pin 1 with a predetermined potential to start the nibble mode, a refresh control signal may also be applied to pin 1 in the same way as in a conventional 64K bit dynamic RAM. In this case, when the pin 1 is at a first predetermined level (e.g. a low potential level) the D-RAM can be placed in the refresh mode, and when the pin 1 has a second predetermined potential (e.g. a high potential level), the D-RAM will be placed in the nibble mode for data reading or writing. In this manner, a memory having a large capacity can be obtained easily.

In the semiconductor memory device of the embodiment described above, the address signals applied to the same pin in a time-sharing manner are used as address signals which determine the initial stage of the shift register used for selecting one memory cell from the plurality of memory cells selected from the memory cell array. For this reason this semiconductor memory device can be operated easily in the nibble mode simply by making this pin be at the predetermined potential. However, the semiconductor memory device cannot be operated in the nibble mode unless the voltages (signals) applied to different pins change with time if the initial stage of the shift register is determined by address signals applied to different pins. In other words, a specific circuit is needed to change the voltages (signals) applied to the pins on a time basis.

The pin arrangement of the package containing the dynamic RAM of this embodiment is the same as that of a conventional 64K bit dynamic RAM with the only exception being pin 1. Accordingly, a system having 64K bit dynamic RAM can be upgraded to a 256K bit dynamic RAM simply by changing the wiring to wire in the 256K bit RAM in the location where the 64K bit RAM previously was.

In the embodiment described above, single bits of data which are stored in the memory cells selected by the address signals $A_0$–$A_7$ are simultaneously read and latched by each of four main amplifiers, and a shift register is actuated by a $\overline{CAS}$ signal so as to sequentially output the data latched in the main amplifiers. Thus data can be read in at high speed. In the normal mode, a selecting circuit 7 including the shift register is acutated by the most significant bit provided by pin 1 so as to select one memory cell from the memory cells each selected from one of the four memory cell matrices.

This results in a structural advantage for the circuit because a 1M bit (=1,048,576 bits) dynamic RAM can be obtained easily on the basis of the same design concept as the 256K bit dynamic RAM in the following manner without changing the design of the address decoder too much. First, a memory cell array of 1M bit is divided into four memory cell matrices (each having a memory capacity of 256K bits) of the same construction, and one memory cell is selected from each of the memory matrices by address signals $A_0$–$A_8$. The selecting circuit 7 which always operates in nibble mode further selects one memory cell from the four memory cells thus selected. If pin 1 is used as the input pin for the address signal $A_8$, the 1M bit semiconductor memory device can be packaged in a 16-pin package.

The present invention is not particularly limited to the embodiments described above. For example, the number of memory cell matrices forming the memory cell array may be increased, and the output data from the memory matrices may be output serially by the shift register or a similar device. In such a case, the capacity of the memory device can be increased without increasing the number of pins for the address signals by sequentially allotting input data supplied externally to the memory cell matrices by the shift register or the like in the write operation as well. Thus, even a semiconductor memory device having a memory capacity of 1M bit or more can be mounted in a 16-pin package. In this case, as described above, the registers may be of the type that receives a signal output from the decoder 13 as its input when the control signal $\phi_{NF}$ is low level, and receives a signal output from the register of a preceding stage as its input signal when the control signal $\phi_{NF}$ is high level.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor memory device comprising:
    a memory cell array having a plurality of input-output terminals, in which a plurality of memory cells are selected substantially simultaneously and said memory cells thus selected are connected to said input-output terminals in a one-to-one manner;
    a switch circuit having a plurality of input-output terminals provided so as to correspond and be connected to said input-output terminals of said memory cell array in a one-to-one manner, a plurality of control terminals, and a common input-output terminal selectively connected to one of said input-output terminals thereof;
    an input-output circuit having an input-output terminal connected to said common input-output terminal of said switch circuit, an input terminal, and an output terminal, said input-output circuit outputting a signal from said input-output terminal thereof corresponding to a signal applied to said input terminal, or a signal from said output terminal corresponding to a signal applied to said input-output terminal thereof;
    a control circuit outputting control signals; and
    a selecting circuit receiving one of the control signals output from said control circuit and a plurality of signals corresponding to a plurality of address signals, and applying a plurality of selection signals to said control terminals of said switch circuit, for first selectively connecting a predetermined one of said input-output terminals of said switch circuit to said common input-output terminal and for thereafter selectively and sequentially connecting remaining input-output terminals of said switch circuit other than said predetermined one of said input-output terminals to said common input-output terminal.

2. The semiconductor memory device as defined in claim 1, wherein said selecting circuit comprises:
    an internal selecting circuit with a plurality of output terminals, said internal selecting circuit receiving a plurality of signals corresponding to said address signals, and outputting a plurality of internal selection signals determined by said plurality of signals thus received; and
    a shift register comprised of a plurality of registers provided so as to correspond in a one-to-one manner to said output terminals of said internal selcting circuit, said shift register receiving said internal selection signals applied via said output terminals of said internal selecting circuit corresponding thereto and said control signals output from said control circuits,
    wherein said control circuit includes means coupled to said shift register to operate said shift register to first output said selection signals which connect one of the input-output terminals of said switch circuit determined by said internal selection signals to said common input-output terminal of said switch circuit, and then to subsequently output said selection signals which selectively and sequentially connect other input-output terminals of said switch circuit to said common input-output terminal every time said shift register is operated in correspondence with the control signals.

3. The semiconductor memory device as defined in claim 2, wherein said switch circuit is comprised of a plurality of gate circuits constituted by insulated gate field-effect transistors.

4. The semiconductor memory device as defined in claim 2, wherein said internal selecting circuit comprises a decoder circuit decoding a plurality of signals corresponding to a plurality of said address signals.

5. The semiconductor memory device as defined in claim 4, wherein the plurality of said signals corresponding to said plurality of address signals being applied to said internal selecting circuit comprise first signals based on first address signals applied at a first timing and second signals based on second address signals applied at a second timing.

6. The semiconductor memory device as defined in claim 5, wherein said selecting circuit comprises a first latch circuit latching said first signals and applying said latched first signals to said decoder circuit, and a second latch circuit latching said second signals and applying said latched second signals to said decoder circuit.

7. The semiconductor memory device as defined in claim 5, wherein said control circuit comprises a first terminal to which a first control signal determining said first timing is applied, a second terminal to which a second control signal determining said second timing is applied, and an internal control circuit outputting said control signals for operating said shift register when said first and second control signals are applied to said first and second terminals at a predetermined timing relationship, so that memory cells are selected sequentially from said plurality of memory cells selected from said memory cell array and are connected to said input-ouput terminal of said input-output circuit.

8. The semiconductor memory device as defined in claim 7, which further comprises a memory cell selecting circuit outputting selection signals for selecting said plurality of memory cells from said memory cell array, and in which said memory cells thus selected are connected to said input-output terminals of said memory cell array, thereby executing the writing or reading of data into or from said selected memory cells via said input-output terminals.

9. A semiconductor memory device as defined in claim 8, further comprising a plurality of amplifiers each of which latches the data read from said selected memory cell.

10. The semiconductor memory device as defined in claim 8, wherein said memory cell selecting circluit comprises a first buffer circuit which receives a first address signal supplied at the first timing and a second address signal applied at the second timing and applies said first and second signals to said decoder circuit; a second buffer circuit which receives a plurality of third address signals applied at said first timing, and a plurality of fourth address signals supplied at said second timing, and outputs a plurality of third signals based on said plurality of third address signals and a plurality of fourth signals based on said plurality of fourth address signals; and a second decoder circuit which receives the plurality of said third and fourth signals and outputs selection signals for selecting said plurality of memory cells from said memory cell array.

11. The semiconductor memory device as defined in claim 10, wherein said memory cell array comprises a plurality of memory cell matrices each containing a plurality of memory cells, and each of said memory cell matrices has one of said plurality of input-out terminals.

12. The semiconductor memory device as defined in claim 10, wherein said memory cell selecting circuit further comprises a common terminal receiving said first address signal supplied at the first timing and said second address signal supplied at the second timing, and in which said first and second address signals are applied from said common terminal to said first buffer circuit.

13. The semiconductor memory device as defined in claim 12, wherein the number of said input-output terminals of said memory cell array is 4.

14. The semiconductor memory device as defined in claim 12, which is packaged in a package having a plurality of pins and in which said common terminal of said memory cell selecting circuit is connected to one of said plurality of pins.

15. The semiconductor memory device as defined in claim 14, wherein said plurality of pins are consecutively numbered for identification beginning with a predetermined pin identified as pin 1, and wherein said pin to which said common terminal of said memory cell selecting circuit is connected is said pin 1.

16. The semiconductor memory device as defined in claim 14, wherein the number of said input-output terminals of said memory cell array is 4.

17. The semiconductor memory device as defined in claim 14, wherein said first terminal of said control circuit is connected to one of two pins of said plurality of pins other than that connected to said common terminal of said memory cell selecting circuit, and said second terminals of said control circuit is connected to the other of said two pins.

18. A semiconductor memory device comprising:
a memory cell array having a plurality of input-output terminals, in which a plurality of memory cells are selected substantially simultaneously and said memory cells thus selected are connected to said input-output terminals in a one-to-one manner;
a switch circuit having a plurality of input-output terminals provided so as to correspond and be connected to said input-output terminals of said memory cell array in a one-to-one manner, a plurality of control terminals, and a common input-output terminal selectively connected to one of said input-output terminals thereof;
an input-output circuit having an input-output terminal connected to said common input-output terminal of said switch circuit, an input terminal, and an output terminal, said input-output circuit outputting a signal from said input-output terminal thereof corresponding to a signal applied to said input terminal, or a signal from said output terminal corresponding to a signal applied to said input-output terminal thereof;
a control circuit outputting control signals; and
a selecting circuit including means responsive to an internal selection signal for first outputting to said control terminals of said switch circuit a selection signal which connects a predetermined input-output terminal of said plurality of input-output terminals of said switch circuit to said common input-output terminal, and thereafter outputting to said control terminals selection signals which connect sequentially and selectively a plurality of input-output terminals other than said predetermined input-output terminal to said common input-output terminal when the control signals are output from said control circuit.

19. The semiconductor memory device as defined in claim 18 wherein said selecting circuit comprises:
an internal selecting circuit with a plurality of output terminals, said internal selection circuit outputting a plurality of predetermined internal selection signals; and
a shift register comprised of a plurality of registers receiving the control signals output from said control circuit and the second selection signals and outputting said selection signals in accordance with said control signals and internal selection signals, and
wherein said shift register includes means for first outputting said selection signals which connect one of said plurality of input-output terminals of said switch circuit determined by said internal selection signals to said common input-output terminal, and the outputting said selection signals which connect sequentially and selectively said input-output terminals of said switching circuit to said common input-output terminal every time said shift register is operated in correspondence with the control signals.

20. The semiconductor memory device as defined in claim 19, which further comprises a memory cell selecting circuit outputting selection signals for selecting said plurality of memory cells from said memory cell array, and in which said memory cells thus selected are connected to said input-output terminals of said memory cell array, thereby executing the writing or reading of data into or from said selected memory cells via said input-output terminals of said memory array.

21. A semiconductor memory device as defined in claim 20, further comprising a plurality of amplifiers each of which latches the data read from said selected memory cell.

22. The semiconductor memory device as defined in claim 20, wherein said memory cell selecting circuit comprises a buffer circuit receiving a plurality of first address signals supplied at a first timing and a plurality of second address signals supplied at a second timing and outputting a plurality of first signals based on said plurality of first address signals and a plurality of second signals based on said plurality of second address signals; and a decoder circuit receiving the plurality of said first and second signals and outputting selecting signals for selecting said plurality of memory cells from said memory cell array.

23. The semiconductor memory device as defined in claim 22, wherein said control circuit comprises an internal control circuit having a first terminal to which a first control signal determining said first timing is applied and a second terminal to which a second control signal determining said second timing is applied, and wherein said internal control circuit outputs said control signals for operating said shift register when said first and second control signals are applied to said first and second terminals at a predetermined timing relationship, whereby said memory cells are selected sequentially from said plurality of memory cells selected from said memory cell array and are connected to said input-output terminal of said input-output circuit.

24. The semiconductor memory device as defined in claim 23, which is packaged in a package having a plurality of pins, said first terminal of said control circuit being connected to one of two pins of said plurality of pins and said second terminal of said control circuit is connected to the other of said two pins.

25. The semiconductor memory device as defined in claim 24, wherein said switch circuit is comprised of a plurality of gate circuits constituted by insulated gate field-effect transistors.

26. A semiconductor memory device comprising:
a memory cell array comprised of a plurality of memory cell matrices which each have a plurality of memory cells formed along rows and columns;
an address buffer coupled to receive address signals having a predetermined number of bits;
an input buffer having an input terminal for receiving data to be written into said memory cell array during a writing operation;
an output buffer having an output terminal for outputting information to be read from said memory cell array during a reading operation;
X and Y decoders coupled to said address buffer and said memory cell array to simultaneously select a memory cell in each of said memory cell matrices in accordance with a first portion of the address signal received from said address buffer, which first portion is comprised of a predetermined number of less significant bits of said address signal;
first and second switching means each respectively coupled to all of the simultaneously selected memory cells from said memory cell array;
a common input terminal coupled between an output of said input buffer and inputs said first switching means;
a common output terminal coupled between an input of said output buffer and outputs of said second switching means; and
selecting means coupled to said first and second switching means to control the coupling of individual ones of said simultaneously selected memory cells from said memory cell array to said common input terminal when said memory device is in the writing operation and to said common output terminal when said memory device is in the reading operation in accordance with a second portion of said second address signal which is comprised of a predetermined number of more significant bits of said address signal.

27. A semiconductor memory device according to claim 26, further comprising control means coupled to said selecting means and said address buffer, wherein said control means includes means for operating said selecting means to operate in a first mode to change the selection of the individual memory cells coupled to said input terminal or said output terminal only in accordance with a change in said second portion of said address signal and means to operate in a second mode wherein the initial selection of an individual memory cell from said plurality of memory cells for connection to said common input or said common output terminal is based on said second portion of said address signal after which the selection of other individual memory cells from said plurality of simultaneously selected memory cells for connection to said common input terminal or said common output terminal is carried out in a sequential operation in accordance with a control signal sequence received by said control means without the need for a further change in fhe second portion of said address signal.

28. A semiconductor memory device according to claim 27, wherein said second portion of said address signal is the most significant bit of said address signal and the first portion of said address signal is all of the bits of said address signal other than said most significant bit.

29. A semiconductor memory device according to claim 28, wherein said most significant bit is always the same predetermined number which is determined by a predetermined potential applied to said address buffer as said most significant bit.

30. A semiconductor memory device according to claim 29, wherein said predetermined potential is provided from within said semiconductor device so that said predetermined most significant bit is provided without the need for receiving an external address bit corresponding to said most significant bit from outside of said memory device.

31. A semiconductor memory device according to claim 29, wherein said predetermined potential is provided by applying said predetermined potential to an external pin of said semiconductor device.

32. A semiconductor memory device according to claim 27, wherein said control means further comprises:
a first gate coupled between said address buffer and said selecting means to control the coupling of the second portion of said address signal to said selecting means;
a second gate coupled to said selecting means to control the operation of said selecting means to sequentially select individual memory cells without the need for changing said second portion of said address signal in said second operating mode; and
a gate control circuit coupled to said first and second gates to control the operation thereof in accordance with a mode selection signal provided to said semiconductor device from an external mode selecting device.

33. A semiconductor memory device according to claim 27, further comprising means for synchronizing the receipt of data into said input buffer with said control signal sequence applied to said selecting means from said control means when said semiconductor device is operating in the second mode during a writing operation.

34. A semiconductor memory device according to claim 26, further comprising control means for initially selecting an individual memory cell from said plurality of simultaneously selected memory cells for connection to said common input terminal or said common output terminal based on said second portion of said address signal and for subsequently selecting other individual memory cells from said plurality of simultaneously selected memory cells for connection to said common input terminal or said common output terminal in accordance with a sequential operation based on a control signal sequence received by said control means without the need for a further change in the second portion of said address signal.

35. A semiconductor memory device according to claim 34, wherein said second portion of said address signal is the most significant bit of said address signal and the first portion of said address signal is all of the bits of said address signal other than said most significant bit.

* * * * *